(12) United States Patent
Aviram et al.

(10) Patent No.: US 6,348,299 B1
(45) Date of Patent: Feb. 19, 2002

(54) RIE ETCH RESISTANT NONCHEMICALLY AMPLIFIED RESIST COMPOSITION AND USE THEREOF

(75) Inventors: Ari Aviram, Croton-on-Hudson; Inna V. Babich, Chappaqua, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/351,428

(22) Filed: Jul. 12, 1999

(51) Int. Cl.$^7$ .................................................. G03C 5/16
(52) U.S. Cl. ........................ 430/322; 430/323; 430/326; 430/325; 430/296
(58) Field of Search ............................. 430/270.1, 310, 430/322, 323, 325, 326

(56) References Cited

U.S. PATENT DOCUMENTS

| | | | | |
|---|---|---|---|---|
| 3,359,226 A | * | 12/1967 | Giddings | 524/108 |
| 3,532,708 A | * | 10/1970 | Blance et al. | 524/300 |
| 4,234,660 A | * | 11/1980 | McKenna, Jr. et al. | 428/411 |
| 4,268,639 A | * | 5/1981 | Seidel et al. | 252/303 |
| 4,419,482 A | * | 12/1983 | Teyssie et al. | 524/560 |
| 4,558,076 A | * | 12/1985 | Wright et al. | 523/442 |
| 4,921,880 A | * | 5/1990 | Lee et al. | 522/12 |
| 4,931,316 A | * | 6/1990 | Johnson | 427/227 |
| 5,116,812 A | * | 5/1992 | Lelental et al. | 505/1 |
| 5,260,195 A | * | 11/1993 | Azhar et al. | 435/25 |
| 5,328,806 A | * | 7/1994 | Toukhy | 430/296 |
| 5,424,368 A | * | 6/1995 | Miyazaki et al. | 525/293 |
| 5,908,732 A | * | 6/1999 | Aviram et al. | 430/296 |
| 5,955,242 A | * | 9/1999 | Aviram et al. | 430/296 |
| 6,159,600 A | * | 12/2000 | Ryang et al. | 428/379 |
| 6,194,481 B1 | * | 2/2001 | Furman et al. | 522/77 |
| 6,197,896 B1 | * | 3/2001 | Aviram et al. | 525/370 |

FOREIGN PATENT DOCUMENTS

EP  059109  * 9/1982

OTHER PUBLICATIONS

Nishiuchi et al. Japanese patent (JP 60210528 A) abstract, Production of fibrous alkali metal titanate.*

* cited by examiner

*Primary Examiner*—Janet Baxter
*Assistant Examiner*—Yvette M. Clarke
(74) *Attorney, Agent, or Firm*—Connolly Bove Lodge & Hutz LLP; Daniel P. Morris

(57) ABSTRACT

Photoresist compositions of improved reactive ion etching comprising polymers of 2-hydroxyalkyl methacrylate and/or 2-hydroxyalkylacrylate and a titanate, zirconate and/or hafnate are provided. The photoresist compositions are used for forming positive lithographic patterns.

39 Claims, No Drawings

RIE ETCH RESISTANT NONCHEMICALLY AMPLIFIED RESIST COMPOSITION AND USE THEREOF

TECHNICAL FIELD

The present invention relates to photoresist compositions which exhibit enhanced resistance to plasma and especially to Cl/O plasma used in reactive ion etching. The present invention is concerned with the compositions as well as their use in lithography. For instance, the materials of the present invention are suitable for use in device fabrication on all optical, e-beam, x-ray and ion-beam lithography tools.

BACKGROUND OF INVENTION

In the manufacture of patterned devices and especially microelectric devices, the processes of etching different layers which constitute the finished product are among the most crucial steps involved. One method widely employed in the etching process is to overlay the surface to be etched with a suitable mask.

The mask is typically created by imagewise forming a pattern of photoresist material over those areas of the substrate to be shielded from the etching. The photoresist is normally formed of a polymeric organic material. The pattern is formed by imagewise exposing the photoresist material to irradiation by photolithographic techniques. The irradiation employed is usually x-ray, UV radiation, or electron beam radiation.

Photosensitive materials and/or compositions are either positive-acting (i.e. photosolubilizable) or negative-acting (i.e. photoinsolubilizable or photocrosslinkable). Positive-working (photosensitive compositions are rendered soluble (or developable) by actinic radiation (deep-near UV, x-ray or electron-beam) and can be removed using selective developing solutions leaving unexposed areas intact. Negative-working (photosensitive compositions are those which become insoluble upon exposure to actinic radiation. Selected solutions can dissolve and remove the unexposed areas of the composition while leaving the exposed portions intact. Development of such exposed materials yields negative tone images.

Concerning positive working resists, it is well known in the art that the photochemical formation of carboxylic acids, be it by amplified means such as a catalytic acidic-decomposition of a tertiary butyl ester, or as in the case of the photochemical decomposition of 1,2-naphthoquinone diazides, can be employed to produce high resolution and high efficiency resists. This type of reaction is being relied upon extensively in the production of positive working resists.

The manufacture of integrated circuits and other patterned devices relies primarily on resist materials that enable the formation of high resolution patterns. In the search for materials and methods for formation of patterns below 0.25 microns, it is recognized that such patterns require exposure sources based on UV radiation below 248 nm, or on x-ray, or on e-beams. Likewise, it is essential to employ resist materials suitable for use with short wavelengths sources. In the case of UV radiation, it might be convenient to use excimer laser sources that produce radiation at 193 nm.

U.S. patent application Ser. No. 08/700,348 discloses certain polymer compositions that when exposed to actinic light such as UV radiation below 240 nm, or soft rays, x-ray or e-beam, undergo a photochemical reaction that leads to the formation of pendant carboxylic acid groups, which are base soluble. This photochemical reaction is very efficient and can be used for high resolution positive resists.

In particular, the resists are non-amplified polymers having pendant recurring groups selected from the group consisting of —COO—$CH_2$—CH(OH)—$(CH_2)_x$—H, wherein x is 0–20;

—COO—$CH_2$—CH(OH)—$(CH_2)_y$—HE—$(CH_2)_z$—H; and mixtures thereof, wherein HE is O or S, and each y and z individually is 1–18, and mixtures thereof.

U.S. patent application Ser. No. 08/717,644 discloses using certain copolymers for minimizing possible water absorption of the non-irradiated regions of the resist film. These copolymers are from monomers consisting essentially of:

1) $CH_2CHCOOCH_2CHOH(CH_2)_nH$ and/or $CH_2C(CH_3) CHOOCH_2CHOH(CH_2)_nH$, wherein n=0 to 10; and
2) $CH_2CHCOO(CH_2)_nH$ and or $CH_2C(CH_3) COO(CH_2)_nH$, wherein n=1 to 10. The amount of 1) is about 75 to about 95, preferably about 80 to about 90, and most preferably about 84 to about 87 wt. % and the amount of 2) is about 5 to about 25, preferably about 10 to about 20 and most preferably about 13 to about 16 wt. %. These weight percents are based upon the total weight of 1) and 2).

The entire disclosures of U.S. patent applications Ser. No. 08/700,348 now U.S. Pat. No. 5,955,242 and Ser. No. 08/717,644 now U.S. Pat. No. 5,908,732 are incorporated herein by reference.

After the photoresist is developed forming the desired mask, the substrate and mask can be immersed in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the selectivity of direction (anisotropy) considered necessary to achieve optimum dimensional consistent with current processing requirements.

Moreover, such wet etching processes are undesirable because of the environmental and safety concerns associated therewith.

Accordingly, various so-called "dry processes" have been suggested to improve the process from an environmental viewpoint, as well as to reduce the relative cost of the etching. Furthermore, these "dry processes" have the potential advantage of greater process control and higher aspect ratio images. Also, when fabricating patterns having feature sizes below 350 nm, dry etching processes are necessary.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched sidewalls.

However, a crucial challenge posed by the reactive ion etching relates to providing photoresist compositions that are sensitive to the radiation employed in its imaging procedure but resistant to the reactive ion etching. A particularly harsh environment for the resist material involves those RIE processes using Cl/O plasma. Most resist materials do not survive long enough in this environment to provide proper protection. The manufacture of optical masks requires a chromium etch step which can be done preferentially by RIE etching. This step requires Cl/O plasma.

Although the above discussed non-chemically amplified resists based upon the polymers disclosed in U.S. Ser. Nos. 08/700,348 and 08/717,644 perform quite well lithographically, their resistance to withstand plasma environments and especially Cl/O plasma is not satisfactory.

Another drawback in using the above-described polymers is that they typically employ special developers which are non-conventional from the viewpoint of industry standards.

SUMMARY OF INVENTION

The present invention provides photoresist compositions which are sensitive to imaging irradiation while exhibiting enhanced resistance to reactive ion etching. The photoresist compositions of the present invention typically exhibit enhanced resistance to reactive ion etching using Cl/0 plasma.

In addition, the present invention provides photoresist compositions based upon polymers from hydroxyalkyl acrylates and/or hydroxyalkylmethacrylates that can be developed with industry standard developers such as tetraethylammonium hydroxide (TEAH). It has also been observed that compositions pursuant to the present invention exhibit improved film Tg and hardness.

In particular, the photoresist compositions of the present invention comprise at least one photosensitive polymer selected from the group consisting of:
  a) polymer having pendant recurring groups selected from the group consisting of
      —COO—$CH_2$—CH(OH)—$(CH_2)_x$—H, wherein x is 0–20;
      —COO—$CH_2$—CH(OH)—$(CH_2)_y$H—-$(CH_2)_z$—H; and mixtures thereof, wherein HE is O or S, and each y and z individually is 1–18;
  b) a copolymer from
    1) at least one monomer selected from the group consisting of 2-hydroxyalkyl methacrylate, 2-hydroxyalkyl acrylate, and mixtures thereof wherein the alkyl has 1–10 carbon atoms; and
    2) at least one monomer selected from the group consisting of alkylacrylate, alkylmethacrylate, and mixtures thereof wherein the alkyl has 1–10 carbon atoms, and wherein the amount of 1) is about 75 to about 95 weight % and the amount of 2) is corresponding about 5 to about 25 weight % being based upon the total weight of 1) and 2); and
  c) mixtures of the above; and at least one compound selected from the group consisting of a titanate, a zirconate, a hafnate and mixtures thereof.

The present invention also relates to a method for forming a pattern of a photoresist which comprises:
  a) providing on a substrate a layer of a photoresist composition which comprises at least one photosensitive polymer selected from the group consisting of:
  a) polymer having pendant recurring groups selected from the group consisting of
      —COO—$CH_2$—CH(OH)—$(CH_2)_x$—H, wherein x is 0–20;
      —COO—$CH_2$—CH(OH)—$(CH_2)_y$—HE—$(CH_2)_z$—H; and mixtures thereof, wherein HE is O or S, and each y and z individually is 1–18;
  b) a copolymer from
    1) at least one monomer selected from the group consisting of 2-hydroxyalkyl methacrylate, 2-hydroxyalkyl acrylate, and mixtures thereof wherein the alkyl has 1–10 carbon atoms; and
    2) at least one monomer selected from the group consisting of alkylacrylate, alkylmethacrylate, and mixtures thereof wherein the alkyl has 1–10 carbon atoms, and wherein the amount of 1) is about 75 to about 95 weight % and the amount of 2) is corresponding about 5 to about 25 weight % being based upon the total weight of 1) and 2); and
  c) mixtures of the above; and at least one compound selected from the group consisting of a titanate, a zirconate, a hafnate and mixtures thereof;
  b) imagewise exposing the layer of photoresist composition to irradiation; and
  c) developing the photoresist to thereby form the pattern.

A still further aspect of the present invention relates to a method for forming a pattern on a substrate which comprises:
  a) providing a layer to be patterned on a substrate;
  b) providing on the layer to be patterned a layer of a photoresist composition which comprises at least one photosensitive polymer selected from the group consisting of:
  a) polymer having pendant recurring groups selected from the group consisting of
      —COO—$CH_2$—CH(OH)—$(CH_2)_x$—H, wherein x is 0–20;
      —COO—$CH_2$—CH(OH)—$(CH_2)_y$—HE—$(CH_2)_z$—H; and mixtures thereof, wherein HE is O or S, and each y and z individually is 1–18;
  b) a copolymer from
    1) at least one monomer selected from the group consisting of 2-hydroxyalkyl methacrylate, 2-hydroxyalkyl acrylate, and mixtures thereof wherein the alkyl has 1–10 carbon atoms; and
    2) at least one monomer selected from the group consisting of alkylacrylate, alkylmethacrylate, and mixtures thereof wherein the alkyl has 1–10 carbon atoms, and wherein the amount of 1) is about 75 to about 95 weight % and the amount of 2) is corresponding about 5 to about 25 weight % being based upon the total weight of 1) and 2); and
  c) mixtures of the above; and at least one compound selected from the group consisting of a titanate, a zirconate, a hafnate and mixtures thereof;
  c) imagewise exposing the layer of photoresist composition to irradiation;
  d) developing the photoresist to form the desired pattern; and
  e) subjecting the layer to be patterned to reactive ion etching with the photoresist acting as a mask to thereby form the desired pattern on the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The polymers employed according to the present invention include polymers containing pendant recurring groups selected from the group consisting of:

—COO—$CH_2$—CH(OH)—$(CH_2)_x$—H, wherein x is an integer of 0–20;

—COO—$CH_2$—CH(OH)—$(CH_2)_y$—HE—$(CH_2)_z$—H; and mixtures thereof, wherein HE is C or S, and each y and z individually is 1–18; and mixtures thereof.

Preferred polymers employed according to this aspect of the present invention are poly(2-hydroxyalkyl acrylate) and poly(2-hydroxyalkyl methacrylate) polymers.

The alkyl groups are straight or branched chain saturated hydrocarbon having from 1 to 22 carbon atoms.

Some examples of these poly(2-hydroxyalkyl acrylate) and poly(2-hydroxyalkyl methacrylate) polymers are:

Poly(2-hydroxyethyl methacrylate)
Poly(2-hydroxypropyl methacrylate)
Poly(2-hydroxyethyl acrylate)
Poly(2-hydroxypropyl acrylate)
Poly(2-hydroxybutyl acrylate)
Poly(2-hydroxypentyl acrylate).

Other suitable homopolymers include those having as backbone a polyacrylate, a polymethacrylate, a polymaleate, and a polyvinyl alcohol.

In addition, copolymers employed according to the present invention are from:

1) at least one monomer selected from the group consisting of 2-hydroxyalkyl methacrylate, 2-hydroxyalkyl acrylate, and mixtures thereof wherein the alkyl has 1–10 carbon atoms; and 2) at least one monomer selected from the group consisting of alkylacrylate, alkylmethacrylate, and mixtures thereof wherein the alkyl has 1–10 carbon atoms.

The amount of 1) is about 75 to about 95, preferably about 80 to about 90, and most preferably about 84 to about 87 wt. %; and the amount of 2) is about 5 to about 25, preferably about 10 to about 20 and most preferably about 13 to about 16 wt. %. These weight percents are based upon the total weight of 1) and 2).

The copolymers employed in the present invention are copolymers of 2-hydroxyalkyl methacrylate and/or 2-hydroxyalkyl acrylate with alkylacrylate and/or alkylmethacrylate. As used in describing the resins which may be used in this invention, the term alkyl in the ester moiety refers to a straight or branched chain hydrocarbon having from 1 to 10 carbon atoms and containing no unsaturation. Specific copolymers suitable for purposes of the present invention are: copolymers of 2-hydroxyethyl methacrylate and methylmethacrylate; copolymers of 2-hydroxypropyl methacrylate and methylmethacrylate; copolymers of 2-hydroxyethyl methacrylate and t-butylmethacrylate; copolymers of 2-hydroxypropyl methacrylate and t-butylmethacrylate; copolymers of 2-hydroxyethyl acrylate and t-butylmethacrylate ; copolymers of 2-hydroxypropyl acrylate and t-butylmethacrylate; copolymers of 2-hydroxyethyl methacrylate and methacrylate; copolymers of 2-hydroxypropyl methacrylate and methylacrylate; copolymers of 2-hydroxyethyl acrylate and of 2-methylmethacrylate; copolymers of 2-hydroxypropyl acrylate and methylmethacrylate; copolymers of 2-hydroxyethyl acrylate and methylacrylate; copolymers of 2-hydroxypropyl acrylate and methylacrylate; copolymers of 2-hydroxypropyl acrylate and methylacrylate; copolymers of 2-hydroxybutyl methacrylate and methylmethacrylate; copolymers of 2-hydroxybutyl acrylate and methylmethacrylate; and copolymers of 2-hydroxypentyl acrylate and methylmethacrylate.

The polymers of the present invention typically have weight average molecular weight of about $10^4$ to about $10^6$, more typically about 50,000 to about 650,000, an example being about 300,000. The polymers typically have Tg of up to about 70° C. The polymers are prepared by polymerization of the selected relative amount of monomers in an organic diluent such as isopropanol or tetrahydrofuran under reflux in a nitrogen atmosphere for about 24 hours in the presence of about 0.4% by weight of a free radical catalyst such as azoisobutyricdinitrile. The relative amount of organic diluent typically is about 20 to about 100 parts by weight per 1 part by weight of the monomers.

The polymer in the case of isopropanol is then precipitated out of solution by adding about 1 part by weight of water per 1 part of the isopropanol and then dried. In the case of tetrahydrofuran, the polymer is obtained by evaporating off the tetrahydrofuran, followed by dissolving in an alcohol such as isopropanol and then precipitating the polymer by adding water. The amount of alcohol and water typically is about 20 to about 100 parts by weight per 1 part of the starting monomers.

It has been found according to the present invention that the addition of titanates, zirconates and hafnates and more particularly organotitanates, organozirconates and organohafnates enhance the resistance of the polymers to plasma and especially Cl/O plasma Moreover, it has been observed that upon exposure to irradiation, very little change in sensitivity to the irradiation occurs. Also, improvement in developing conditions is achieved.

Preferably the compounds employed are alkyl titanates, alkyl zirconates and alkyl hafnates. Typically, the alkyl groups contain 1 to 15 carbon atoms and more typically 1 to 8 carbon atoms.

Examples of some suitable compounds for use in the present invention are tetraalkoxy metal compounds such as titanium tetramethoxide, titanium tetraethoxide, titanium tetrapropoxide, titanium tetrabutoxide, titanium tetrapentoxide, titanium tetrahexoxide, titanium tetraheptoxide, titanium tetraoctoxide, zirconium tetramethoxide, zirconium tetraethoxide, zirconium tetrapropoxide, zirconium tetrabutoxide, zirconium tetrapentoxide, zirconium tetrahexooxide, zirconium tetraheptoxide, zirconium tetraoctoxide, and hafnium tetraethylhexano-tert-butoxide. Mixtures of any of the compounds can be used if desired.

The titanates, zirconates and hafnates are typically employed in amounts of about 0.1 to about 5% by weight, more typically about 0.3 to about 3% by weight, and preferably about 0.4 to about 3% by weight based upon the weight of the photoresist polymer.

The above alkyl compounds can be included in solutions of the polymer in relatively large amounts without causing the polymer to precipitate. Typically, the solutions include an organic solvent such as dimethylformamide perfluoroisopropanol or 1-methyl-1-pyrrolidinone along with a cosolvent such as ethanol. The solution can then be coated onto the desired substrate, such as by spin casting. Preferred substrates are those used in fabricating integrated circuits. Typical film thicknesses of the compositions are about 0.3 to about 1 micron and more typically about 0.5 to about 1 micron (dry). In addition, the films are typically baked after deposition at temperatures of about 100° C. to about 150° C. and more typically at about 120° C. to about 140° C. to cause crosslinking.

It is believed that the titanates, zirconates and hafnates crosslink the photoresist polymer. For instance, crosslinking would occur through an equilibrium between the alkoxy of the additive with a hydroxyl group of the polymer. The following illustrates such reaction using an alkoxy titanate as an example:

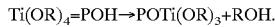

Surprisingly, irradiation of crosslinked polymers according to the present invention produce positive working photoresists. This may be due to side chains of the photoresist detaching from the main chain upon irradiation thereby breaking the crosslinking bridges.

The following illustrates one of many possible fabrication sequences for using the composition of the present invention for microlithography. In this particular sequence, a pattern of chromium metal on a quartz plate is provided by the following steps:

1. A thin film of chromium metal is provided on the surface of a quartz plate;
2. The metal layer is coated with the resist;
3. The resist is patterned;
4. The plate is developed in a suitable developer;
5. The exposed chromium film is etched either by wet etch or by dry etch;
6. The residual resist is removed.

The following non-limiting example is presented to further illustrate the present invention:

EXAMPLE

To a solution of about 1 g of poly(2-hydroxyethyl methacrylate) in about 15 ml NMP were added about 8 ml ethanol followed by a solution of 0.3 g of TYZOR TOT in 2 ml ethanol. The last solution was added dropwise with stirring. The solution was spin coated onto Si wafers at 2000 RPM. The wafer was baked at about 100° C. for about five minutes. The final film thickness was 0.375 microns.

To illustrate the effectiveness of the present invention, TYZOR TOT is a commercially available alkyl titanate containing 2.55% (w) titanium. Its addition to the poly(2-hydroxyethyl methacrylate) reduced the etch rate (in a chlorine/oxygen plasma environment) from 2220 A/min for poly(2-hydroxyethyl methacrylate) to only 800 A/min. This compares favorably with the rate of Novolak (825 A/min), an industry standard.

The improved RIE resistance rate is evident from the data presented in Table 1.

TABLE 1

| Material | Etch Rate |
| --- | --- |
| Poly-Hema (SPAR) | 2182 (Å/min) |
| Poly-Hema/10% TI Additive (0.86% Actual TI) | 831 (Å/min) |
| Poly-Hema/20% TI Additive (1.7% Actual TI) | 614 (Å/min) |
| Poly-Hema 30% TI Additive (2.6% Actual TI) | 614 (Å/min) |
| Poly-Hema/40% TI Additive (3.4% Actual TI) | 529 (Å/min) |

The e-beam sensitivity of the above-mentioned titanate films is 12 microcoul/sq.cm. at 50 KV. This represents a very slight decrease in sensitivity compared to poly HEMA which is about 10 microcoul/sq.cm at 50 KV. The resolution obtained so far for e-beam is 0.25 microns.

The foregoing description of the invention illustrates and describes the present invention Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a pattern of a photoresist which comprises:
   a) providing on a substrate a layer of a method which comprises at least one photosensitive polymer selected from the group consisting of:
      1) polymer having pendant recurring groups selected from the group consisting of
         —COO—$CH_2$—CH(OH)—$(CH_2)_x$—H, wherein x is 0–20;
         —COO—$CH_2$—CH(OH)—$(CH_2)_y$—HE—$(CH_2)_z$—H;
         and mixtures thereof, wherein HE is O or S, and each y and z individually is 1–18;
      2) a copolymer from
         i) at least one monomer selected from the group consisting of 2-hydroxyalkyl methacrylate, 2-hydroxyalkyl acrylate, and mixtures thereof wherein the alkyl has 1–10 carbon atoms; and
         ii) at least one monomer selected from the group consisting of alkylacrylate, alkylmethacrylate, and mixtures thereof wherein the alkyl has 1–10 carbon atoms, and wherein the amount of i) is about 75 to about 95 weight % and the amount of ii) is corresponding about 5 to about 25 weight % being based upon the total weight of i) and ii); and 3) mixtures of the above; and at least one compound selected from the group consisting of a tetraalkoxy titanate, a tetraalkoxy zirconate, a tetraalkoxy hafnate and mixtures thereof;

b) imagewise exposing the layer of method to irradiation; and c) developing the photoresist to thereby form the pattern.

2. The method of claim 1 wherein the at least one compound is a tetraalkoxy titanate.

3. The method of claim 2 wherein the titanate is titanium tetramethoxide.

4. The method of claim 2 wherein the titanate is titanium tetraethoxide.

5. The method of claim 2 wherein the titanate is titanium tetrapropoxide.

6. The method of claim 2 wherein the titanate is titanium tetrabutoxide.

7. The method of claim 2 wherein the titanate is titanium tetrapentoxide.

8. The method of claim 2 wherein the titanate is titanium tetrahexoxide.

9. The method of claim 2 wherein the titanate is titanium tetraheptoxide.

10. The method of claim 2 wherein the titanate is titanium tetraoctoxide.

11. The method of claim 1 wherein the compound is a tetraalkoxy zirconate.

12. The method of claim 11 wherein the zirconate is zirconium tetramethoxide.

13. The method of claim 11 wherein the zirconate is zirconium tetraethoxide.

14. The method of claim 11 wherein the zirconate is zirconium tetrapropoxide.

15. The method of claim 11 wherein the zirconate is zirconium tetrabutoxide.

16. The method of claim 11 wherein the zirconate is zirconium tetrapentoxide.

17. The method of claim 11 wherein the zirconate is zirconium tetrahexoxide.

18. The method of claim 11 wherein the zirconate is zirconium tetraheptoxide.

19. The method of claim 11 wherein the zirconate is zirconium tetraoctoxide.

20. The method of claim 1 wherein the compound is a tetraalkoxy hafliate.

21. The method of claim 20 wherein the hafliate is hafnium teftaethylhexanotert-butoxide.

22. The method of claim 1 wherein the polymer comprises poly(betahydroxyalkyl methacrylate).

23. The method of claim 1 wherein the polymer comprises poly(betahydroxyethyl methacrylate).

24. The method of claim 1 wherein the polymer comprises a copolymer selected from the group cosisting of copolymer of 2-hydroxyethyl methacrylate and methylmethacrylate; copolymer of 2-hydroxyethyl methacrylate and methylmethacrylate; copolymers of 2-hydroxyethyl methcrylate and t-butylmethacrylate; copolymers of 2-hydroxypropyl methacrylate and t-butylmethacrylate; copolymers of 2-hydroxyethyl acrylate and t-butylmethacrylate; copolymers of 2-hydroxypropyl acrylate and t-butylmethacrylate; copolymers of 2-hydroxyethyl methacrylate and methacrylate; copolymers of 2-hydroxypropyl methacrylate and methylacrylate; copolymers of 2-hydroxyethyl acrylate and methylmethacrylate; copolymers of 2-hydroxypropyl acrylate and methylmethacrylate; copolymers of 2-hydroxyethyl acrylate and methylacrylate; copolymers of 2-hydroxypropyl acrylate and methylacrylate; copolymers of 2-hydroxypropyl acrylate and methylacrylate; copolymers of 2-hydroxybutyl methacrylate and methylmethacrylate; copolymers of 2-hydroxybutyl acrylate and methylmethacrylate; and copolymers of 2-hydroxypentyl acrylate and methylmethacrylate mixtures.

25. The method of claim 1 wherein the polymer comprises a copolymer of 2-hydroxyethyl methacrylate and methylmethacrylate.

26. The method of claim 1 wherein the polymer comprises a copolymer of 2-hydroxyethyl methacrylate and t-butyl methacrylate.

27. The process of claim 1 wherein the irradiation is deep UV irradiation with wavelengths below 240 nm.

28. The process of claim 1 wherein the irradiation is x-ray irradiation.

29. The process of claim 1 wherein the irradiation is e-beam irradiation.

30. The process of claim 1 wherein a developer comprising an aqueous solution of a material selected from the group consisting of ammonium hydroxide, tetramethyl ammonium hydroxide and pyridine is employed.

31. The process of claim 1 which further comprises baking the layer of photoresist prior to step b).

32. A method for forming a pattern on a substrate which comprises:

a) providing a layer to be patterned on a substrate;

b) providing on the layer to be patterned a layer of a photoresist composition which comprises at least one photosensitive polymer selected from the group consisting of:

1) polymer having pendant recurring groups selected from the group consisting of
—COO—$CH_2$—CH(OH)—$(CH_2)_x$—H, wherein x is 0–20;
—COO—$CH_2$—CH(OH)—$(CH_2)_y$—HE—$(CH_2)_z$—H; and mixtures thereof, wherein HE is O or S, and each y and z individually is 1–18;

2) a copolymer from
i) at least one monomer selected from the group consisting of 2-hydroxyalkyl methacrylate, 2-hydroxyalkyl acrylate, and mixtures thereof wherein the alkyl has 1–10 carbon atoms; and
ii) at least one monomer selected from the group consisting of alkylacrylate, alkylmethacrylate, and mixtures thereof wherein the alkyl has 1–10 carbon atoms, and wherein the amount of i) is about 75 to about 95 weight % and the amount of ii) is corresponding about 5 to about 25 weight % being based upon the total weight of i) and ii; and 3) mixtures of the above; and at least one compound selected from the group consisting of a tetraalkoxy titanate, a tetraalkoxy zirconate, a tetraalkoxy hafnate and mixtures thereof;

c) imagewise exposing the layer of method to irradiation;

d) developing the photoresist to form the desired pattern; and e) subjecting the layer to be patterned to reactive ion etching with the photoresist acting as a mask to thereby form the desired pattern on the substrate.

33. The process of claim 32 wherein the reactive ion etching is a Cl/O plasma.

34. The method of claim 32 wherein the at least one compound is a tetraalkoxy titanate.

35. The method of claim 32 wherein the compound is a tetraalkoxy zirconate.

36. The method of claim 32 wherein the compound is a tetraalkoxy hafnate.

37. The method of claim 32 wherein the polymer comprises a poly(betahydroxyalkyl methacrylate).

38. The method of claim 32 wherein the polymer comprises poly(betahydroxyethyl methacrylate).

39. The method of claim 32 wherein the polymer comprises a copolymer selected from the group consisting of copolymer of 2-hydroxyethyl methacrylate and methylmethacrylate; copolymers of 2-hydroxypropyl methacrylate and methylmethacrylate; copolymers of 2-hydroxyethyl methacrylate and t-butylmethacrylate; copolymers of 2-hydroxypropyl methacrylate and t-butylmethacrylate; copolymers of 2-hydroxyethyl acrylate and t-butylmethacrylate; copolymers of 2-hydroxypropyl acrylate and t-butylmethacrylate; copolymers of 2-hydroxyethyl methacrylate and methacrylate; copolymers of 2-hydroxypropyl methacrylate and methylacrylate; copolymers of 2-hydroxyethyl acrylate and methylmethacrylate; copolymers of 2-hydroxypropyl acrylate and methylmethacrylate; copolymers of 2-hydroxyethyl acrylate and methylacrylate; copolymers of 2-hydroxypropyl acrylate and methylacrylate; copolymers of 2-hydroxypropyl acrylate and methylacrylate; copolymers of 2-hydroxybutyl methacrylate and methylmethacrylate; copolymers of 2-hydroxybutyl acrylate and methylmethacrylate; and copolymers of 2-hydroxypentyl acrylate and methylmethacrylate mixtures.

* * * * *